United States Patent [19]

Sittig

[11] 4,298,880
[45] Nov. 3, 1981

[54] POWER THYRISTOR AND METHOD OF FABRICATION THEREFORE UTILIZING CONTROL, GENERATING, AND FIRING GATES

[75] Inventor: Roland Sittig, Umiken, Switzerland

[73] Assignee: BBC, Brown, Boveri & Co., Ltd., Baden, Switzerland

[21] Appl. No.: 9,913

[22] Filed: Feb. 6, 1979

[30] Foreign Application Priority Data

Jun. 15, 1978 [CH] Switzerland ............... 6523/78

[51] Int. Cl.³ .................................. H01L 29/74
[52] U.S. Cl. ............................... 357/38; 357/55; 357/86
[58] Field of Search ..................... 357/38, 55, 86

[56] References Cited

U.S. PATENT DOCUMENTS 4,012,761  3/1977  Ferro et al. ............. 357/38
4,223,331  9/1980  Müller et al. ............ 357/38

FOREIGN PATENT DOCUMENTS 2500384  11/1975  Fed. Rep. of Germany ...... 357/38
1195998   6/1970  United Kingdom ............ 357/38

Primary Examiner—Joseph E. Clawson, Jr.
Attorney, Agent, or Firm—Oblon, Fisher, Spivak, McClelland & Maier

[57] ABSTRACT

A power thyristor formed by four zones of alternating conductivity type and including at least one control gate, at least one generator gate in the vicinity of a respective control gate and at least one firing gate located further away from a respective control gate formed on portions of the cathode-base zone extending to the cathode-side main surface, in which the firing gate is electronically connected to the generator gate with no intervening cathode-base zone. The control gate, generator gate, firing gate, cathode zone and cathode base zone are dimensioned so that the ratio between the lateral path resistance of the cathode base zone between the generator gate and cathode zone, and the corresponding resistance between the firing gate and the cathode zone, and the ratio between the edge-length of the generator gate and the edge-length of the firing gate are such that a current furnished by the generator gate suffices to fire the thyristor in the region beneath the firing gate, even at low anode voltages and small firing currents.

3 Claims, 3 Drawing Figures

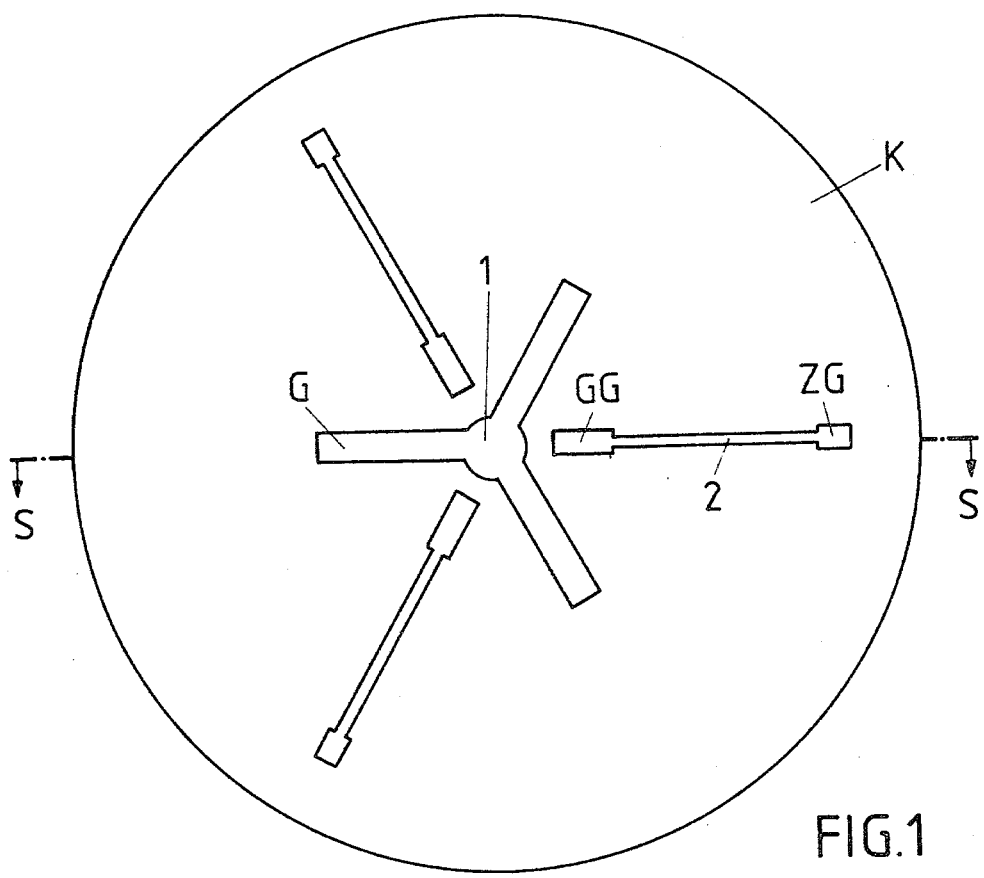
FIG.1
FIG.2
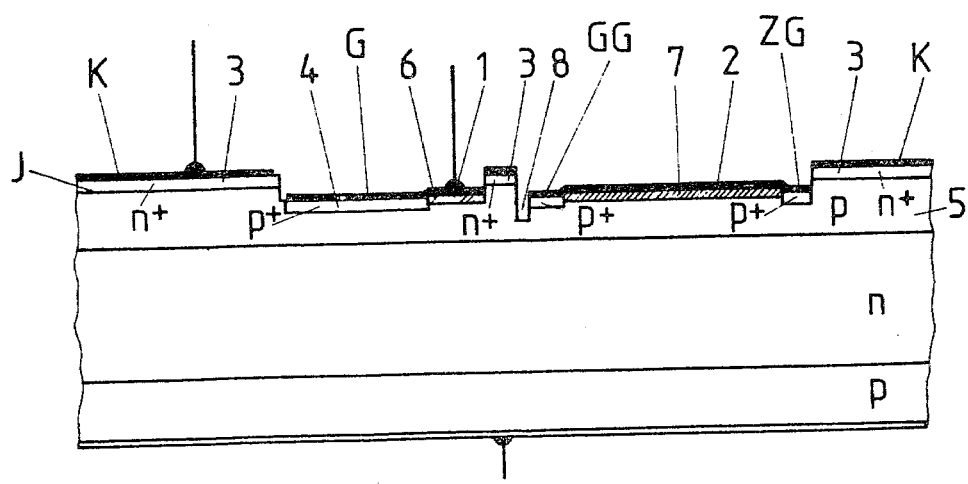

POWER THYRISTOR AND METHOD OF FABRICATION THEREFORE UTILIZING CONTROL, GENERATING, AND FIRING GATES

BACKGROUND OF THE INVENTION

1. Field of the Invention

This invention relates to a power thyristor and a method of fabricating a power thyristor having at least three electrodes arranged on the cathode-base zone thereof, where one electrode serves as a control or gate electrode, and where one electrode (generator gate) next to the control gate serves for drawing a current and the other electrode serves as a supplementary firing electrode (firing gate).

2. Description of the Prior Art

Thyristors of the type mentioned above are known, e.g. from DE-OS No. 21 46 178. In these known components the thyristors include an amplifying gate for internal reinforcement of firing. In order to obtain uniform firing over the entire thyristor surface, firing gates are provided on the cathode-side surface which are controlled by the amplifying gate (auxiliary thyristor) acting as a generator gate. These known thyristors have several following disadvantages. Firstly, if the anode current of a fired thyristor drops, the current in the thyristor is no longer uniformly distributed over the entire cathode surface, but flows only at certain places. Secondly since the auxiliary thyristor itself does not fire at the very low anode voltage of the fired thyristor ($\leq 2$ V), firing does not occur in the region of the firing gate when a rise in anode current is experienced. The current then arising locally in the thyristor can lead to destruction of the component.

In order to achieve a uniform firing distribution it is further known to increase the area of the control electrode, or to increase the thyristor emitter edge-length. Such measures, however, have as a consequence the necessity of very high firing currents.

SUMMARY OF THE INVENTION

Accordingly, it is the object of this invention to provide a novel thyristor of the aforementioned type, as well as a method of fabricating such a thyristor, in which, on the one hand, no high firing currents are required and, in which, on the other hand, firing via the firing gate is possible even with small anode voltages.

These and other objects are achieved according to the invention by providing a novel power thyristor, and method of fabrication thereof, formed by four zones of alternating conductivity type with cathode and anode zones respectively adjacent thyristor cathode and anode main surfaces, and a cathode-base zone and an anode-base zone respectively adjacent said cathode and anode zones, said thyristor having at least three electrodes zones formed on portions of the cathode base zone extending to the cathode main surface including a control gate, a generator gate adjacent said control gate, and a firing gate electrically connected to said generator gate with no intervening cathode-base zone, wherein the control gate, generator gate, firing gate, cathode zone and cathode base zone are dimenstioned so that the ratio between the lateral path resistance of the cathode base zone between the generator gate and the cathode zone, and the corresponding resistance between the firing gate and the cathode zone, and the ratio between the edge-length of the generator gate and the edge-length of the firing gate are such that a current furnished by the generator gate suffices to fire the thyristor in the region beneath the firing gate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a schematic top view of the surface on the cathode side of a thyristor;

FIG. 2 is a cross sectional view through the thyristor of FIG. 1 along the line S—S.

DETAILED DESCRIPTION OF THE PREFERRED EMBODIMENTS

Figure 3:
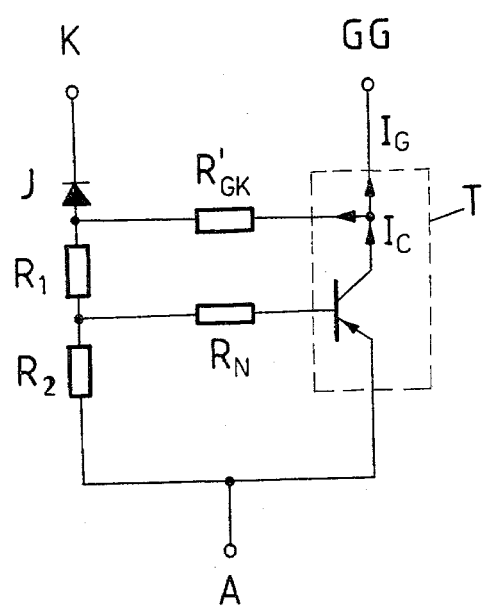
FIG. 3 is a circuit diagram of the equivalent circuit of a fired thyristor provided with a generator gate.

Referring now to the drawings, wherein like reference numerals designate identical or corresponding parts throughout the several views, and more particularly to FIG. 1 thereof, the designation K denotes the thyristor cathode metallization and the designation G denotes the thyristor control gate electrode, which consists of three arms extending from a central contact spot 1. Between each pair of arms of the control electrode G is provided a generator gate, denoted GG connected to a firing gate, denoted ZG, at the edge of the thyristor by a conductor 2.

Referring to FIG. 2, which is a cross sectional view through the thyristor of FIG. 1 along the line S—S, beneath the cathode metallization K is the cathode zone 3 and under the control electrode G is the gate zone 4 which is surrounded by the P-base (cathode-base) zone 5. The contact spot 1 and the cathode-base zone are separated from one another by the insulating layer 6 (e.g. $SiO_2$). The conductor 2 connecting the generator gate GG and the firing gate ZG is also insulated from the cathode-base 5 by an oxide layer 7. The cathode-base 5 is highly doped (P+ —regions) under both the generator gate GG and the firing gate ZG.

In the dimensioning of the two gates GG and ZG, the following is to be considered. After ignition of the thyristor in the vicinity of the gate G the anode voltage collapses very rapidly. Although the thyristor is not yet ignited under the firing gate ZG, the voltage between cathode and anode is only a few volts (frequently $\leq 2$ V). In spite of this meager anode voltage the current $I_G$ furnished by the generator gate GG must suffice to excite the cathode zone 3 near the firing gate ZG to inject electrons into the cathode-base 5, and thereby to initiate firing in this portion of the thyristor also.

In the dimensioning of the firing gate ZG, therefore, the lateral resistance $R_{GK}$ of the cathode-base 5 between the cathode zone 3 and any firing gate ZG is made as small as possible, because then the voltage drop across this resistance is small and the voltage on the gate acts directly on the zone junction J. Preferably the voltage drop across the resistance $R_{GK}$ at the minimum firing current $I_G$ should be less than 0.2 V. In order to make the path resistance $R_{GK}$ as small as possible, the distance between firing gate ZG, or the cathode-side edge of the P+ —zone under the firing gate, and the gate-side edge of the cathode zone 3 is made as small as possible. A further possibility for increasing the firing sensitivity is to make the cathode-side gate edge as short as possible. (cf. FIG. 1).

In contrast to the case of the firing gate it is to be seen to, in the dimensioning of the generator gate GG, that the lateral resistance $R_{GK}'$ of the cathode-base zone 5 between the gate GG, and the cathode zone 3 is made as large as possible. At the least, $R_{GK}'$ should be three times greater than $R_{GK}$. This is to be explained with the help of the equivalent circuit of a fired thyristor given in FIG. 3 as follows.

According to FIG. 3, the fired thyristors between cathode contact K and anode contact A consists of a diode formed by the junction J and oriented in the flow direction, and two resistances $R_1$ and $R_2$ characterizing the ohmic voltage drop in the current saturated region (P- and N-base zones). Between generator gate GG and anode A, on the contrary, is a pure transistor structure. This transistor T is controlled by the lateral electron current in the N-base (anode base) over a corresponding path resistance $R_N$. As soon as the collector-emitter voltage on the thyristors exceeds the saturation voltage $U_{saturated}$, a constant collector current $I_c$ flows. The current $I_G$ obtainable from the generator gate GG is then:

$$I_G = I_C - \frac{U_{GK} - U_{J1}}{R_{GK'}}$$

Depending on the magnitude of the path resistance $R'_{GK}$ in the cathode-base zone 5, yet another current is superimposed on the collector current $I_C$. An increase in the generator current $I_G$ is thus, apart from the choice of a longer gate edge, essentially possible by making the path resistance and/or the collector current $I_C$ correspondingly large. A large $I_C$ is obtained, in particular, when the current $j_o$ flowing through the thyristor is made correspondingly large, since $I_c \sim \sqrt{j_o}$ when $j_o$ denotes the current density of the fired thyristor beneath the cathode. For large resistance values $R'_{GK}$, the gate can furnish, in the ideal case, the current $I_c$ at a voltage $U_{AK}$-$U_{saturated}$.

The lateral resistance $R'_{GK}$ of the cathode-base 5 between cathode zone 3 and generator gate GG should thus be made as large as possible. An increase in this resistance is obtained preferably by an additional etching of a groove 8 (FIG. 2) in the P-base 5. This groove-etching has the advantage that the resistance $R'_{GK}$ is very sharply increased without the necessity of increasing significantly the distance between the generator gate and the cathode zone 3. A further possibility for increasing the current $I_G$ is to make the cathode-side gate edge as long as possible (cf. FIG. 1).

Obviously, numerous modifications and variations of the present invention are possible in light of the above teachings. It is therefore to be understood that within the scope of the appended claims, the invention may be practiced otherwise than as specifically described herein.

What is claimed as new and Desired to be secured by Letters Patent of the United States is:

1. A power thyristor formed by four zones of alternating conductivity type with cathode and anode zones respectively adjacent opposed thyristor main cathode and anode surfaces, and a cathode-base zone and an anode-base zone respectively adjacent said cathode and anode zones, comprising:

said thyristor having portions of said cathode-base zone extended to said cathode main surface on which there is formed at least one control gate adapted to be coupled to an ignition circuit for the ignition of the thyristor, at least one generator gate separated from said control gate but adjacent thereto for furnishing a current to ignite parts of the thyristor remote from said control gate, and at least one firing gate being fed with said current from said generator gate and being arranged near said remote parts;

said generator gate electrically connected to said firing gate with no intervening cathode-base zone;

the ratio of the lateral resistance $R'_{GK}$ between the generator gate and the nearest part of the cathode zone, and the lateral resistance $R_{GK}$ between the firing gate ZG and the nearest part of the cathode zone, satisfying the relationship $R_{GK}/R'_{GK} < \frac{1}{3}$; and the ratio between the edge—length of the generator gate and the edge—length of the firing gate satisfying the relationship $I'_G \cdot R_{GK} < 0.2$ V, where $I'_G$ denotes the minimum gate current at which the thyristor still fires in the vicinity of the firing gate.

2. A power thyristor according to claim 1, wherein the control electrode comprises:

plural arms radiating from a central contact spot, where the contact spot, is insulated from the cathode-base zone;

wherein between any two arms of the control gate there is situated a generator gate, and a firing gate.

3. A power thyristor according to claim 2, further comprising:

a groove formed in the cathode-base zone between the generator gate and a portion of the cathode-zone lying between said generator gate and said contact spot;

whereby the lateral path resistance $R'_{GK}$ between the generator gate and said portion of said cathode zone is increased.

* * * * *